(12) United States Patent
Gao et al.

(10) Patent No.: US 11,019,724 B2
(45) Date of Patent: May 25, 2021

(54) PRINTED CIRCUIT BOARD AND COMMUNICATIONS DEVICE

(71) Applicant: HUAWEI TECHNOLOGIES CO., LTD., Guangdong (CN)

(72) Inventors: Feng Gao, Dongguan (CN); Ertang Xie, Dongguan (CN); Wei Jing, Dongguan (CN)

(73) Assignee: HUAWEI TECHNOLOGIES CO., LTD., Guangdong (CN)

(*) Notice: Subject to any disclaimer, the term of this patent is extended or adjusted under 35 U.S.C. 154(b) by 0 days.

(21) Appl. No.: 16/727,402

(22) Filed: Dec. 26, 2019

(65) Prior Publication Data
US 2020/0137887 A1   Apr. 30, 2020

Related U.S. Application Data

(63) Continuation of application No. PCT/CN2018/082322, filed on Apr. 9, 2018.

(30) Foreign Application Priority Data

Jun. 27, 2017   (CN) ......................... 201710502428.X

(51) Int. Cl.
*H05K 1/11* (2006.01)
*H05K 1/02* (2006.01)
*H05K 3/42* (2006.01)

(52) U.S. Cl.
CPC .............. *H05K 1/113* (2013.01); *H05K 1/111* (2013.01); *H05K 1/0243* (2013.01); *H05K 3/429* (2013.01);

(Continued)

(58) Field of Classification Search
CPC ......... H05K 1/113; H05K 2201/09409; H05K 2201/09427; H05K 1/0243;
(Continued)

(56) References Cited

U.S. PATENT DOCUMENTS 5,784,262 A * 7/1998 Sherman .............. H05K 3/3436
361/777
6,388,208 B1   5/2002 Kiani et al.
(Continued)

FOREIGN PATENT DOCUMENTS

CN        1799290 A    7/2006
CN      101010754 A    8/2007
(Continued)

*Primary Examiner* — Ishwarbhai B Patel
(74) *Attorney, Agent, or Firm* — Womble Bond Dickinson (US) LLP

(57) ABSTRACT

This application provides a multilayer printed circuit board (PCB). There is a pad array on a surface of the multilayer PCB. The pad array includes at least one padding unit, and each padding unit includes a first pad and a second pad that are adjacent. Both the first pad and the second pad are connected to a first Z-directed transmission line located in a Z-directed groove. In this way, to wire a signal wire on a signal layer of the multilayer PCB, a quantity of Z-directed grooves that need to be bypassed is less than a quantity of vias that need to be bypassed in the prior art. In other words, wiring of the signal wire is easier to some extent. In addition, this application further provides a corresponding communications device.

14 Claims, 6 Drawing Sheets

(52) U.S. Cl.
CPC .............. *H05K 2201/09409* (2013.01); *H05K 2201/09427* (2013.01); *H05K 2201/09545* (2013.01); *H05K 2201/10666* (2013.01); *H05K 2203/0207* (2013.01)

(58) Field of Classification Search
CPC ......... H05K 2201/09545; H05K 3/429; H05K 2201/10666; H05K 2203/0207; H05K 1/111
See application file for complete search history.

(56) References Cited

U.S. PATENT DOCUMENTS

| | | | |
|---|---|---|---|
| 8,912,862 | B2 | 12/2014 | Biran et al. |
| 2006/0003481 | A1 | 1/2006 | Farnworth et al. |
| 2006/0232301 | A1* | 10/2006 | Morlion ................ H05K 1/114 326/126 |
| 2009/0032948 | A1* | 2/2009 | Hsieh ...................... H01L 24/49 257/738 |
| 2009/0091406 | A1 | 4/2009 | Kushta et al. |
| 2009/0166895 | A1 | 7/2009 | Noguchi et al. |
| 2011/0155434 | A1 | 6/2011 | Reynov et al. |
| 2011/0302775 | A1 | 12/2011 | Cai et al. |
| 2013/0285240 | A1 | 10/2013 | Last et al. |
| 2014/0144675 | A1 | 5/2014 | Hsu |

FOREIGN PATENT DOCUMENTS

| | | |
|---|---|---|
| CN | 101252817 A | 8/2008 |
| CN | 101945536 A | 1/2011 |
| CN | 102111957 A | 6/2011 |
| CN | 102281725 A | 12/2011 |
| CN | 103533751 A | 1/2014 |
| CN | 103260348 B | 2/2016 |
| CN | 107241857 A | 10/2017 |

\* cited by examiner

PRINTED CIRCUIT BOARD AND COMMUNICATIONS DEVICE

CROSS-REFERENCE TO RELATED APPLICATION

This application is a continuation of International Application No. PCT/CN2018/082322, filed on Apr. 9, 2018, which claims priority to Chinese Patent Application No. 201710502428.X, filed on Jun. 27, 2017. The disclosures of the aforementioned applications are hereby incorporated by reference in their entireties.

TECHNICAL FIELD

This application relates to the communications field, and in particular, to a printed circuit board and a communications device.

BACKGROUND

As signal transmission rates of network devices increase, pads are arranged increasingly densely on a surface of a multilayer printed circuit board (PCB). Generally, corresponding to each pad on the surface of the multilayer PCB, there is a through hole or blind via (referred to as a "via" hereinafter) in the multilayer PCB. Usually, pads and vias are in a one-to-one correspondence. Therefore, when pads are arranged more densely, vias are also arranged more densely. It should be known that, on a signal layer of the multilayer PCB, a signal wire needs to be wired in a region between two adjacent vias. As the density of vias increases, more vias need to be bypassed in wiring of the signal wire. As a result, it is more difficult to wire the signal wire on the signal layer.

SUMMARY

This application provides a multilayer printed circuit board (PCB), to make wiring of signal wires easier to some extent. In addition, this application further provides a corresponding communications device.

According to a first aspect, this application provides a multilayer PCB. The multilayer PCB includes a plurality of layers of subboards, and there is a pad array on a surface of the multilayer PCB. The pad array has X rows and Y columns, where both X and Y are integers greater than or equal to 2.

The pad array includes at least one padding unit, the padding unit includes a first pad and a second pad, and the first pad and the second pad are adjacent.

Correspondingly, the multilayer PCB further has a Z-directed groove, and the Z-directed groove penetrates through some or all subboards of the multilayer PCB from the surface of the multilayer PCB in a thickness direction of the multilayer PCB.

Further, both the first pad and the second pad are located on one side of the Z-directed groove.

It should be noted that, for ease of description, in this application, the side of the Z-directed groove on which the first pad and the second pad are located is defined as a first side of the Z-directed groove. In addition, in inner walls of the Z-directed groove, an inner wall closer to the first pad and the second pad is defined as a first inner wall ("first inner wall" is directly used hereinafter without further clarification).

There is a first Z-directed transmission line on the first inner wall, and the first Z-directed transmission line extends in the thickness direction of the multilayer PCB. To be specific, the extending direction of the first Z-directed transmission line is a straight line direction, and the extending direction of the first Z-directed transmission line is the same as the thickness direction of the multilayer PCB.

It should be noted that both the first pad and the second pad are connected to the first Z-directed transmission line.

It can be learned that, in one embodiment, the Z-directed groove takes the place of a via, and two pads on one side of the Z-directed groove are both connected to one first Z-directed transmission line in the Z-directed groove. In other words, in this embodiment, one Z-directed groove may correspond to two pads, and therefore, Z-directed grooves in the PCB are arranged less densely than vias in a PCB in the prior art. Correspondingly, if a quantity of pads is given, a quantity of Z-directed grooves that need to be bypassed in wiring of a signal wire in this embodiment is less than a quantity of vias that need to be bypassed in wiring of a signal wire in the prior art. Therefore, the technical solution provided in this embodiment makes wiring of signal wires easier to at least some extent.

In one embodiment, the first Z-directed transmission line in the Z-directed groove is not fully spread on all inner walls of the Z-directed groove, but is spread only on a portion of the inner walls of the Z-directed groove (that is, only spread on one inner wall, or in other words, only spread on the first inner wall). It should be known that the first Z-directed transmission line is generally metallic because signals need to be transmitted on the first Z-directed transmission line. For example, the first Z-directed transmission line may be a thick copper layer plated onto an inner wall of the Z-directed groove, provided that the first Z-directed transmission line is shaped into a straight line extending in the thickness direction of the multilayer PCB. Correspondingly, in this embodiment, the first Z-directed transmission line is spread only a portion of the inner walls of the Z-directed groove, and therefore in comparison with a technical solution in which a copper layer is fully plated onto the inner walls of the Z-directed groove, the technical solution provided in this embodiment saves resources.

With reference to the first aspect, in a first possible implementation, both the first pad and the second pad are ground pads, or power pads connected to a same power supply. If the two pads are pads that receive and transmit different signals, connecting the two pads to one signal transmission line results in mutual crosstalk between two different signals on the one signal transmission line, which in turn results in transmission failure of the two different signals.

In one embodiment, the multilayer PCB includes a ground layer, and when both the first pad and the second pad are ground pads, one end of the first Z-directed transmission line, farther from the surface of the multilayer PCB, is connected to the ground layer. It should be noted that, in this application, the surface of the multilayer PCB is a surface on which the pad array is disposed on the multilayer PCB. This clarification applies to all descriptions of "surface of the multilayer PCB" in this application. No clarification is given elsewhere.

In one embodiment, the multilayer PCB includes a power layer, and when both the first pad and the second pad are power pads, one end of the first Z-directed transmission line, farther from the surface of the multilayer PCB, is connected to the power layer.

With reference to the first aspect or the first possible implementation of the first aspect, in a second possible implementation, the padding unit further includes a third pad and a fourth pad. The first pad is not only adjacent to the second pad but also adjacent to the fourth pad, the third pad is also adjacent to both the second pad and the fourth pad, but the first pad is not adjacent to the third pad.

The third pad and the fourth pad are also located on one side of the Z-directed groove. Certainly, the side of the Z-directed groove on which the first pad and the second pad are located is opposite to the side of the Z-directed groove on which the third pad and the fourth pad are located.

The first side is already defined. The other side of the Z-directed groove may be defined as a second side of the Z-directed groove herein, where the other side of the Z-directed groove is opposite to the first side of the Z-directed groove. Correspondingly, both the third pad and the fourth pad are located on the second side of the Z-directed groove.

Further, in this application, in the Z-directed groove, an inner wall closer to the third pad and the fourth pad is defined as a second inner wall ("second inner wall" is directly used hereinafter without further clarification). There is one second Z-directed transmission line on the second inner wall. Like the first Z-directed transmission line, the second Z-directed transmission line also extends in the thickness direction of the multilayer PCB, and the second Z-directed transmission line is isolated from the first Z-directed transmission line.

It can be learned that, in one embodiment, one Z-directed groove corresponds to four pads (the foregoing first pad, second pad, third pad, and fourth pad). Specifically, two Z-directed transmission lines not interfering with each other are provided in the Z-directed groove, which are the first Z-directed transmission line and the second Z-directed transmission line. The two Z-directed transmission lines may be used to transmit different signals. Both the first pad and the second pad are connected to the first Z-directed transmission line, and both the third pad and the fourth pad are connected to the second Z-directed transmission line. Therefore, if a quantity of pads is given, a density of Z-directed grooves in this embodiment is lower than a density of vias in the prior art. Correspondingly, a quantity of Z-directed grooves that need to be bypassed in wiring of a signal wire in this embodiment is less than a quantity of vias that need to be bypassed in the prior art. Therefore, the technical solution provided in this embodiment can make wiring of signal wires easier to at least some extent.

With reference to the second possible implementation of the first aspect, in a third possible implementation, both the third pad and the fourth pad are ground pads, or power pads connected to a same power supply. For why types of the third pad and the fourth pad are limited in this way, refer to the foregoing clarification about the limitation on the types of the first pad and the second pad. No more clarification is made herein.

In one embodiment, the multilayer PCB includes a ground layer, and when both the third pad and the fourth pad are ground pads, one end of the second Z-directed transmission line, farther from the surface of the multilayer PCB, is connected to the ground layer.

In one embodiment, the multilayer PCB includes a power layer, and when both the third pad and the fourth pad are power pads, one end of the second Z-directed transmission line, farther from the surface of the multilayer PCB, is connected to the power layer.

With reference to the first aspect or the first possible implementation of the first aspect, this application further includes a fourth possible implementation. It should be noted that, the fourth possible implementation of the first aspect and the second possible implementation of the first aspect are two parallel implementations, and the two implementations have many similarities. The following focuses on a difference between the two implementations. For similarities, refer to the descriptions of the second possible implementation. Details are not repeatedly described herein.

Specifically, in the fourth possible implementation, there are two second Z-directed transmission lines on the second inner wall, the two second Z-directed transmission lines are isolated from each other, and each of the second Z-directed transmission lines is also isolated from the first Z-directed transmission line.

The third pad and the fourth pad each are connected to one of the second Z-directed transmission lines.

It can be learned that, unlike the second possible implementation, in the fourth possible implementation (or in this embodiment), there are two second Z-directed transmission lines on the second inner wall, and the third pad and the fourth pad each are connected to one of the second Z-directed transmission lines. It should be known that, in this embodiment, one Z-directed groove also corresponds to four pads. If a quantity of pads is given, a density of Z-directed grooves in this embodiment is lower than a density of vias in the prior art. Correspondingly, a quantity of Z-directed grooves that need to be bypassed in wiring of a signal wire in this embodiment is less than a quantity of vias that need to be bypassed in the prior art. Therefore, the technical solution provided in this embodiment can make wiring of signal wires easier to at least some extent.

With reference to the fourth possible implementation of the first aspect, in a fifth possible implementation, the third pad and the fourth pad may be pads of different types, or signal pads configured to receive a pair of differential signals, or signal pads configured to receive different single-ended signals, or power pads configured to receive different power supplies. In any one of the four cases listed above, the third pad and the fourth pad are configured to transmit different signals, and therefore, the third pad and the fourth pad need to be each connected to one second Z-directed transmission line. If the third pad and the fourth pad are connected to one second Z-directed transmission line, two different signals are transmitted on the one second Z-directed transmission line, resulting in serious crosstalk between the two different signals, which in turn results in transmission failure of the two different signals.

In one embodiment, that "the third pad and the fourth pad may be pads of different types" may be specifically that, of the third pad and the fourth pad, one is a ground pad and the other one is a power pad; or one is a ground pad and the other one is a signal pad for receiving a single-ended signal; or one is a power pad and the other one is a signal pad for receiving a single-ended signal.

In one embodiment, when the third pad and the fourth pad each are connected to one second Z-directed transmission line, both the third pad and the fourth pad may be ground pads, or power pads connected to a same power supply.

With reference to the fourth possible implementation of the first aspect or the fifth possible implementation of the first aspect, in a sixth possible implementation, the third pad may be connected to the corresponding second Z-directed transmission line through a first metallic wire, and an extending direction of the first metallic wire is perpendicular to the corresponding second Z-directed transmission line. The first metallic wire is shortest in this case, thereby saving resources.

In one embodiment, the third pad is in direct contact with the second Z-directed transmission line.

With reference to any one of the fourth possible implementation of the first aspect to the sixth possible implementation of the first aspect, in a seventh possible implementation, the fourth pad may be connected to the corresponding second Z-directed transmission line through a second metallic wire, and an extending direction of the second metallic wire is perpendicular to the corresponding second Z-directed transmission line. Similarly, such a limitation is to ensure that the second metallic wire is shortest, so as to help save resources.

In one embodiment, the forth pad is in direct contact with the second Z-directed transmission line.

With reference to any one of the fourth possible implementation of the first aspect to the seventh possible implementation of the first aspect, in an eighth possible implementation, a width of the first Z-directed transmission line is greater than a width of the second Z-directed transmission line.

In one embodiment, in the thickness direction of the multilayer PCB, the width of the first Z-directed transmission line is fixed, and the width of the first Z-directed transmission line is a width of a projection of the first Z-directed transmission line on a plane of the surface of the multilayer PCB in the thickness direction of the multilayer PCB. Similarly, in the thickness direction of the multilayer PCB, the width of the second Z-directed transmission line is fixed, and the width of the second Z-directed transmission line is a width of a projection of the second Z-directed transmission line on a plane of the surface of the multilayer PCB in the thickness direction of the multilayer PCB.

The first Z-directed transmission line is connected to two pads (which means transmission of two signals) while the second Z-directed transmission line is connected to one pad (which means transmission of only one signal). Therefore, the width of the first Z-directed transmission line being limited to be greater than the width of the second Z-directed transmission line can ensure that the two signals transmitted on the first Z-directed transmission line can both be transmitted relatively quickly. This avoids a problem that transmission speeds of the two signals transmitted on the first Z-directed transmission line are relatively low when the width of first Z-directed transmission line equals the width of the second Z-directed transmission line.

In one embodiment, the width of the first Z-directed transmission line is a width of a projection of an end face of the first Z-directed transmission line on the plane of the surface of the multilayer PCB in the thickness direction of the multilayer PCB, where the end face is in contact with the first pad and the second pad. Similarly, the width of the second Z-directed transmission line is a width of a projection of an end face of the second Z-directed transmission line on the plane of the surface of the multilayer PCB in the thickness direction of the multilayer PCB, where the end face is in contact with the third pad or the fourth pad.

Because the first Z-directed transmission line is connected to two pads while the second Z-directed transmission line is connected to one pad, the width of the first Z-directed transmission line being limited to be greater than the width of the second Z-directed transmission line can ensure that the two pads connected to the first Z-directed transmission line can both be in good contact with the first Z-directed transmission line.

With reference to the fifth possible implementation of the first aspect, in a ninth possible implementation, the multilayer PCB includes a signal layer, a power layer, and a ground layer.

When one of the third pad and the fourth pad is a ground pad, and the other pad is a power pad, one end of the second Z-directed transmission line, farther from the surface of the multilayer PCB and connected to the ground pad, is connected to the ground layer, and one end of the second Z-directed transmission line, farther from the surface of the multilayer PCB and connected to the power pad, is connected to the power layer.

When one of the third pad and the fourth pad is a ground pad, and the other pad is a signal pad for receiving a single-ended signal, one end of the second Z-directed transmission line, farther from the surface of the multilayer PCB and connected to the ground pad, is connected to the ground layer, and one end of the second Z-directed transmission line, farther from the surface of the multilayer PCB and connected to the signal pad for receiving a single-ended signal, is connected to the signal layer.

When one of the third pad and the fourth pad is a power pad, and the other pad is a signal pad for receiving a single-ended signal, one end of the second Z-directed transmission line, farther from the surface of the multilayer PCB and connected to the power pad, is connected to the power layer, and one end of the second Z-directed transmission line, farther from the surface of the multilayer PCB and connected to the signal pad for receiving a single-ended signal, is connected to the signal layer.

In one embodiment, the multilayer PCB includes more than two signal layers, and every two of the more than two signal layers transmit different signals.

Correspondingly, when the third pad and the fourth pad are signal pads configured to receive a pair of differential signals, or signal pads configured to receive different single-ended signals, one end of the second Z-directed transmission line, farther from the surface of the multilayer PCB and connected to the third pad, and one end of the second Z-directed transmission line, farther from the surface of the multilayer PCB and connected to the fourth pad, are connected to different signal layers.

In one embodiment, the multilayer PCB includes more than two power layers, and every two of the more than two power layers provide different power supplies.

Correspondingly, when the third pad and the fourth pad are power pads configured to receive different power supplies, one end of the second Z-directed transmission line, farther from the surface of the multilayer PCB and connected to the third pad, and one end of the second Z-directed transmission line, farther from the surface of the multilayer PCB and connected to the fourth pad, are connected to different power layers.

With reference to any one of the first aspect or the first possible implementation of the first aspect to the ninth possible implementation of the first aspect, in a tenth possible implementation, the first pad and the second pad are located in one row, and a length direction of the Z-directed groove is a row direction of the pad array.

In this application, the length direction of the Z-directed groove is a direction of a connection line between two points with a longest distance in an opening corresponding to the Z-directed groove on the surface of the multilayer PCB.

It should be noted that this clarification applies to all descriptions of "length direction of the Z-directed groove" hereinafter in this application. No more clarification is made hereinafter.

In one embodiment, a length of the Z-directed groove is greater than or equal to a minimum distance between the first pad and the second pad.

With reference to any one of the first aspect or the first possible implementation of the first aspect to the ninth possible implementation of the first aspect, in an eleventh possible implementation, the first pad and the second pad are located in one column, and the length direction of the Z-directed groove is a column direction of the pad array.

With reference to the tenth possible implementation of the first aspect or the eleventh possible implementation of the first aspect, in a twelfth possible implementation, when the two adjacent Z-directed grooves have a same length, the two adjacent Z-directed grooves communicate with each other. Such a design is simpler and can improve manufacturing efficiency.

In one embodiment, both the first pad and the second pad are located in a $N^{th}$ row, and both the third pad and the fourth pad are located in a $(N+1)^{th}$ row. Among a plurality of Z-directed grooves between the $N^{th}$ row and the $(N+1)^{th}$ row, every two adjacent Z-directed grooves communicate with each other. N is an integer greater than or equal to 1 and less than or equal to X−1.

In one embodiment, both the first pad and the second pad are located in a $M^{th}$ column, and both the third pad and the fourth pad are located in a $(M+1)^{th}$ column. Among a plurality of Z-directed grooves between the $M^{th}$ column and the $(M+1)^{th}$ column, every two adjacent Z-directed grooves communicate with each other. M is an integer greater than or equal to 1 and less than or equal to Y−1.

With reference to any one of the ninth possible implementation of the first aspect to the twelfth possible implementation of the first aspect, in a thirteenth possible implementation, on the signal layer, a signal wire passes through a region between the two adjacent Z-directed grooves.

In one embodiment, the multilayer PCB includes at least one Z-directed groove and at least one via, and in the at least one Z-directed groove, there is a Z-directed groove adjacent to the via. Therefore, on the signal layer, a signal wire passes through a region between the Z-directed groove and the via that are adjacent. It should be noted that the via may be a through hole or a blind via. A through hole is a via penetrating through the multilayer PCB. A blind via is a via penetrating through some subboards of the multilayer PCB from the surface of the multilayer PCB.

With reference to any one of the first aspect or the first possible implementation of the first aspect to the thirteenth possible implementation of the first aspect, in a fourteenth possible implementation, the Z-directed groove is filled with non-conductive dielectric.

In one embodiment, the non-conductive dielectric is non-conductive resin.

In this embodiment, the non-conductive dielectric is used to isolate the first Z-directed transmission line from the second Z-directed transmission line. In the fourth possible implementation of the first aspect, there are two second Z-directed transmission lines on the second inner wall. In this case, the non-conductive dielectric is also used to isolate the two second Z-directed transmission lines from each other, and isolate both the second Z-directed transmission lines from the first Z-directed transmission line.

In one embodiment, an opening corresponding to the Z-directed groove on the surface of the multilayer PCB is a long thin slit in shape. A length of the slit is a length of the Z-directed groove.

In one embodiment, the opening corresponding to the Z-directed groove on the surface of the multilayer PCB is in a shape of a rectangular, an oval, or a peanut.

In one embodiment, both the first pad and the second pad are located in a $N^{th}$ row, and both the third pad and the fourth pad are located in a $(N+1)^{th}$ row, in which case a width of the Z-directed groove is less than or equal to a spacing between the $N^{th}$ row and the $(N+1)^{th}$ row. It should be noted that the width direction of the Z-directed groove is perpendicular to the length direction of the Z-directed groove. This clarification also applies to other embodiments of this application, and therefore no more clarification is made in any other embodiments. For the value of N, refer to the foregoing statement, which is not repeated herein.

In one embodiment, both the first pad and the second pad are located in a $M^{th}$ column, and both the third pad and the fourth pad are located in a $(M+1)^{th}$ column, in which case a width of the Z-directed groove is less than or equal to a spacing between the $M^{th}$ column and the $(M+1)^{th}$ column. For the value of M, refer to the foregoing statement, which is not repeated herein.

In one embodiment, a spacing between the two the second Z-directed transmission lines is greater than or equal to 4 mils and less than or equal to the length of the Z-directed groove.

In one embodiment, a spacing between the second Z-directed transmission line and the first Z-directed transmission line is greater than or equal to 4 mils and less than or equal to the width of the Z-directed groove.

In one embodiment, a thickness of a Z-directed transmission line is greater than zero and less than half of the width of the Z-directed groove. Optionally, the thickness of the Z-directed transmission line is greater than or equal to 15 micrometers and less than or equal to 50 micrometers. It should be known that the Z-directed transmission line may be the first Z-directed transmission line or the second Z-directed transmission line. This clarification applies to all descriptions of "Z-directed transmission line" hereinafter in this application. No more clarification is made hereinafter.

In one embodiment, in the thickness direction of the multilayer PCB, the width of the Z-directed transmission line is fixed, and the width of the Z-directed transmission line is greater than or equal to 4 mils and less than or equal to 20 mils.

According to a second aspect, this application further provides a communications device. The communications device includes the multilayer PCB described in any one of the foregoing embodiments and an input/output (I/O) chip.

The I/O chip has an X-row and Y-column pin array. Pins of the I/O chip are in one-to-one contact with pads on a surface of the multilayer PCB. It should be noted that, for values of X and Y, reference may be made to the foregoing statements. No more details are described herein.

As described above, on a signal layer of the multilayer PCB, wiring of signal wires is made easier to some extent. Because it is easier to process the multilayer PCB, correspondingly, it is also easier to process the communications device that includes the multilayer PCB.

DESCRIPTION OF EMBODIMENTS

Figure 1:
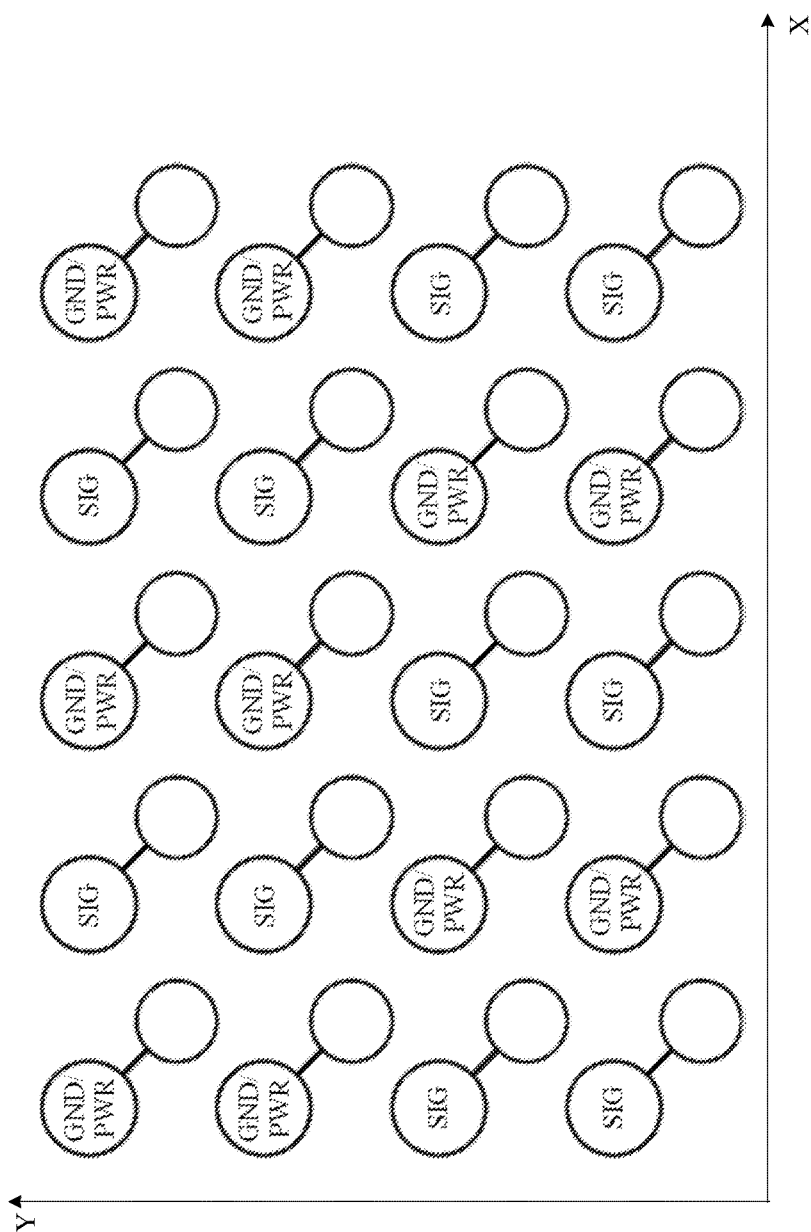
FIG. 1 is a top view of a surface of a multilayer PCB in the prior art.

The following clearly describes the technical solutions in this application with reference to the accompanying drawings in this application.

A multilayer PCB in this application is a PCB including a plurality of layers of subboards. The plurality of layers of subboards include a signal layer subboard (referred to as a "signal layer" hereinafter), a power layer subboard (referred to as a "power layer"), and a ground layer subboard (referred to as a "ground layer" hereinafter). It should be known that the signal layer herein is a subboard for signal transmission, that the power layer is a subboard for power supplying, and that the ground layer is a subboard for grounding.

There is an X-row and Y-column pad array on a surface of the multilayer PCB in this application, where both X and Y are integers greater than or equal to 2. It should be noted that, for X and Y used in any embodiment hereinafter, reference may be made to their definitions given herein. No more description is made hereinafter. A person skilled in the art should know that a plurality of pads included in the pad array may be classified into the following types by purpose: signal pads, power pads, and ground pads. It should be known that the signal pads are configured to receive and transmit signals. The power pads are configured to receive and transmit power. The ground pads are configured for grounding.

Signals are classified into differential signals and single-ended signals, and therefore, the signal pads may be further classified into signal pads for receiving differential signals and signal pads for receiving single-ended signals. It should be known that differential signals appear in pairs, and in this application, differential signals appearing in a pair are described as "a pair of differential signals".

In the prior art, usually, corresponding to each pad of the X-row and Y-column pad array on the surface of the multilayer PCB, there is a via in the multilayer PCB. It should be noted that a via in this application may be a through hole or a blind via. Whether a via is specifically a through hole or a blind via depends on actual circumstances. It should be also noted that, corresponding to different types of pads, types of vias are also different. In this application, a prior-art via connected to a signal pad is referred to as a signal via, a prior-art via connected to a power pad is referred to as a power via, and a prior-art via connected to a ground pad is referred to as a grounded via.

Normally, a same distance is present between every pad and its corresponding via, connection lines between pads and corresponding vias are all parallel to each other, and a same minimum included angle is present between a connection line between every pad and its corresponding via and a straight line of a row of the pad array (for example, the minimum included angle is 45 degrees). Therefore, corresponding to the X-row and Y-column pad array, there is also an X-row and Y-column via array on the multilayer PCB.

It should be known that, for a $K^{th}$ row of pads in the pad array (where K is an integer greater than or equal to 1 and less than or equal to X−1), there is a corresponding $K^{th}$ row of vias in the via array, where the $K^{th}$ row of vias may be located between the $K^{th}$ row of pads and a $(K+1)^{th}$ row of pads. Further, when K is equal to X, the $K^{th}$ row of vias corresponding to the $K^{th}$ row of pads may be located on an outer side of the $K^{th}$ row of pads. Similarly, for the $J^{th}$ column of pads in the pad array (where J is an integer greater than or equal to 1 and less than or equal to Y−1), there is a corresponding $J^{th}$ column of vias in the via array, where the $J^{th}$ column of vias may be located between the $J^{th}$ column of pads and the $(J+1)^{th}$ column of pads. Further, when J is equal to Y, the $J^{th}$ column of vias corresponding to the $J^{th}$ column of pads may be located on an outer side of the $J^{th}$ column of pads.

Specifically, FIG. 1 is a top view of a surface of a multilayer PCB in the prior art. As shown in FIG. 1, there is a 4-row and 5-column pad array on the surface of the multilayer PCB, in which case, X is equal to 5 and Y is equal to 4. In addition, there is also a 4-row and 5-column via array on the surface of the multilayer PCB (strictly speaking, a 5-row and 4-column opening array should be seen in FIG. 1, where each opening is an opening of a via on the surface of the multilayer PCB penetrating through some or all subboards of the multilayer PCB. The direct description "4-row ans 5-column" herein is merely for ease of description. However, a person skilled in the art should know that in fact, it is impossible to see a via array directly on the surface of the multilayer PCB). For the multilayer PCB shown in FIG. 1, the foregoing statements are observed by a relationship between every pad and a corresponding via, a relationship between every row of pads and a corresponding row of vias, and a relationship between every column of pads and a corresponding column of vias. No more details are described herein.

It should be noted that, in FIG. 1, circles marked with GND/PWR represent ground pads or power pads, circles marked with SIG represent signal pads, and blank circles represent vias. From the foregoing descriptions, it is easily learned that, in the prior art, on a signal layer of the multilayer PCB, a signal wire passes through a region between two adjacent through holes. On the surface of the multilayer PCB, if an area of a region in which vias are arranged is given, a higher density of vias means more vias, and correspondingly, more vias need to be bypassed to wire the signal wire. Therefore, if the area of the region in which the vias are arranged is not increased, a higher density of vias means more difficult wiring of the signal wire.

The multilayer PCB provided in this application is used to make it easier to some extent to wire a signal wire on the signal layer of the multilayer PCB.

Figure 2:
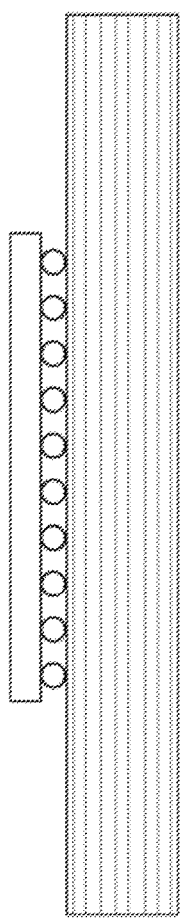
FIG. 2 is a structural diagram of a communications device according to this application.

Before the multilayer PCB provided in this application is described, application scenarios of the multilayer PCB are described with reference to FIG. 2. FIG. 2 is a schematic structural diagram of a communications device. The communications device includes the multilayer PCB provided in this application and an input/output (I/O) chip. The I/O chip has an X-row and Y-column pin array, and there is an X-row and Y-column pad array on a surface of the multilayer PCB. Pins and pads are in a one-to-one correspondence, and each pin is in contact with a corresponding pad.

It should be noted that the I/O chip may be a high-speed serializer/deserializer (SERDES) interface chip, a memory chip, a processor chip, or the like.

Specifically, at present, pin spacings of mainstream I/O chips include 1.0 mm, 0.8 mm, 0.65 mm, 0.5 mm, 0.4 mm, and the like. The pin spacing is a distance between two adjacent pins. Two adjacent pins may be located in one row or one column. Usually, a same distance is present between every two adjacent pins located in one row, and a same distance is present between every two adjacent pins located in one column. For brevity of description in this application, a distance between two adjacent pins located in one row is referred to as a row pin spacing, and a distance between two adjacent pins located in one column is referred to as a column pin spacing. It should be known that, in one pad array, a row pin spacing and a column pin spacing may be the same or different.

From the foregoing descriptions, it is easily known that each pad in the pad array is in contact with a corresponding pin. Therefore, a distance between two adjacent pads (referred to as a "pad spacing" hereinafter) in the pad array is corresponding to the pin spacing described before. To be specific, a row pad spacing is the same as the row pin spacing, and a column pad spacing is the same as the column pin spacing. The row pad spacing is a distance between two adjacent pads located in one row. The column pad spacing is a distance between two adjacent pads located in one column. Similarly, in the pad array, a same distance is present between every two adjacent pads located in one row, and a same distance is also present between every two adjacent pads located in one column.

Figure 3:
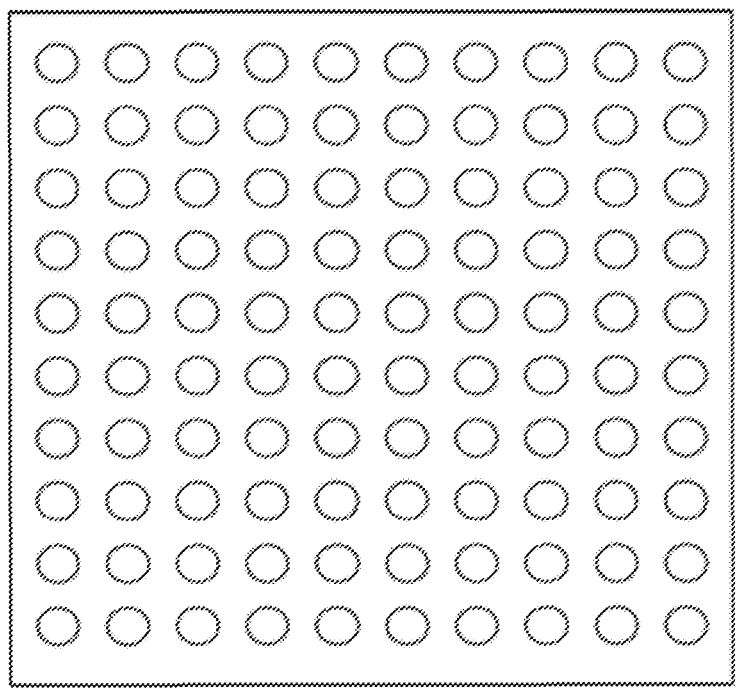
FIG. 3 is a structural diagram of an input/output (I/O) chip in the prior art.
Figure 4A:
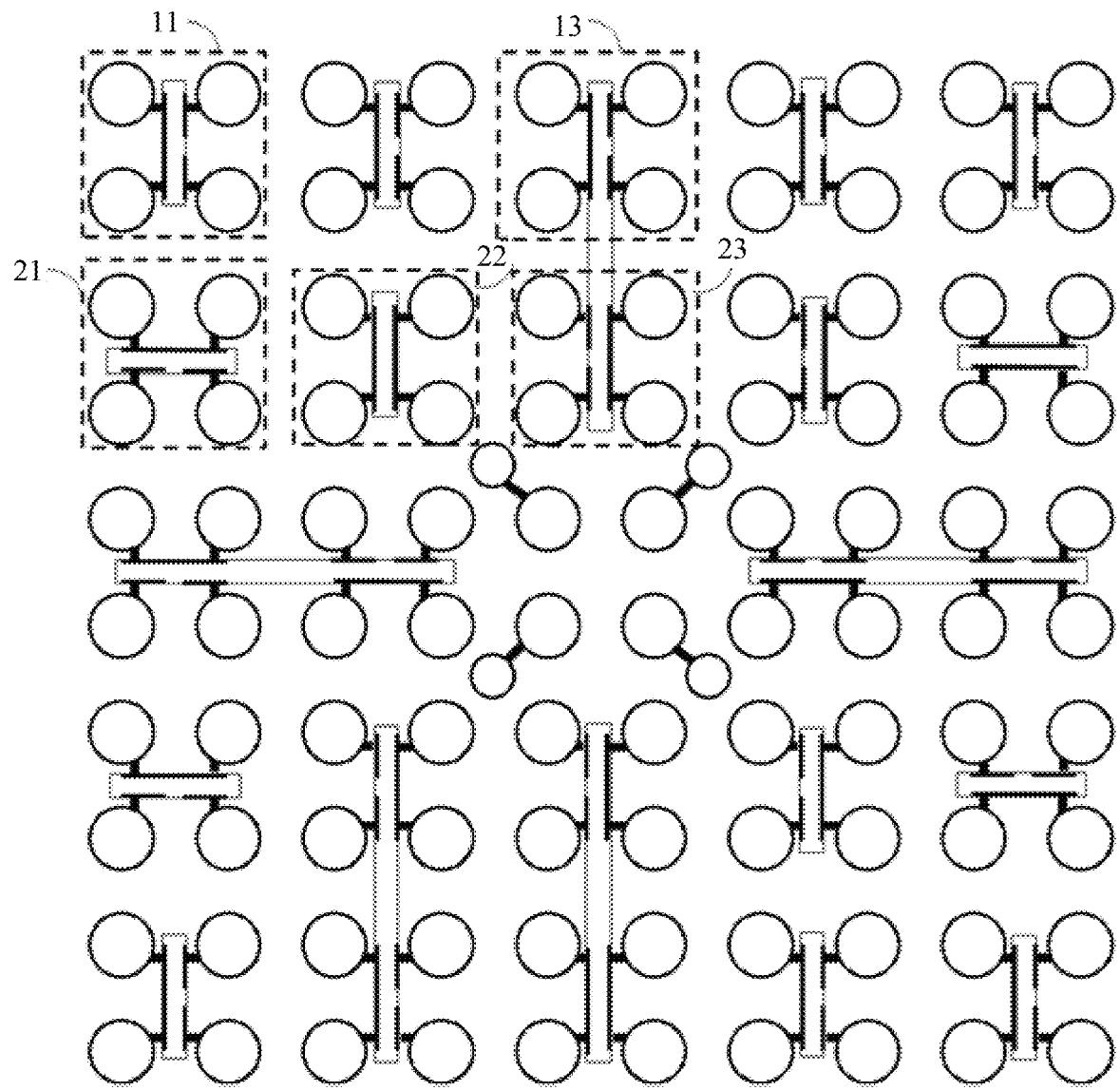
FIG. 4A is a structural diagram of a multilayer PCB according to this application.

FIG. 3 is a structural diagram of an I/O chip. Specifically, FIG. 3 is a structural diagram of a pin array of the I/O chip. It can be seen that the I/O chip has a 10-row and 10 column pin array. FIG. 4A is a structural diagram of a multilayer PCB according to this application. Specifically, FIG. 4A is a top view of a surface of the multilayer PCB. In FIG. 4A, it is easily seen that there is a pad array on the surface of the multilayer PCB. The pad array has 10 rows and 10 columns. It should be known that the pin array in FIG. 3 corresponds to the pad array in FIG. 4A. Therefore, in a communications device that includes the I/O chip shown in FIG. 3 and the multilayer PCB shown in FIG. 4A, pins and pads are in a one-to-one correspondence, and each pin is in contact with a corresponding pad.

Figure 4B:
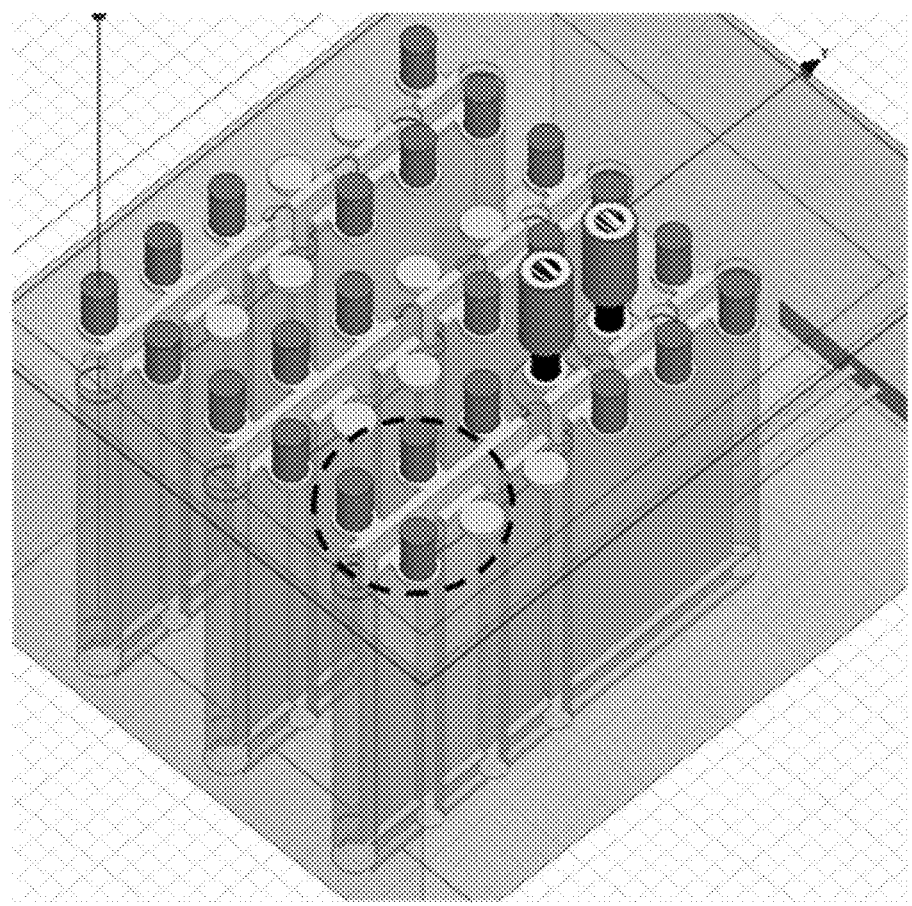
FIG. 4B is a three-dimensional diagram of a multilayer PCB according to this application.

The following describes the multilayer PCB provided in this application. In one embodiment, there is an X-row and Y-column pad array on the surface of the multilayer PCB. The pad array includes at least one padding unit. The padding unit includes a first pad and a second pad. The first pad and the second pad are adjacent. FIG. 4B is a three-dimensional diagram of the multilayer PCB according to this application. A portion surrounded by a dashed circle in FIG. 4B is a padding unit.

It should be noted that the first pad and the second pad are merely used to state that they are two different pads, and "first" and "second" do not constitute any limitation on the pads. In this application, "first", "second", "third", and "fourth" are used to distinguish between a plurality of components of a same type (for example, pads) when being used to modify the components, and "first", "second", "third", and "fourth" do not constitute any limitation on features of the components.

The multilayer PCB is further provided with a Z-directed groove. The Z-directed groove is a groove located in the multilayer PCB penetrating through the multilayer PCB in a thickness direction of the multilayer PCB, or a groove penetrating through some subboards of the multilayer PCB from a surface of the multilayer PCB in a thickness direction of the multilayer PCB. Like a through hole, the Z-directed groove may penetrate through the multilayer PCB in the thickness direction of the multilayer PCB, or like a blind via, the Z-directed groove penetrates through only some subboards of the multilayer PCB in the thickness direction of the multilayer PCB. It should be noted that, when the Z-directed groove penetrates through only some subboards of the multilayer PCB, an opening of the Z-directed groove faces the surface of the multilayer PCB on which the pad array is located. The opening of the Z-directed groove is a long thin slit in shape. The long thin slit may be in a shape of a rectangular, an oval, a peanut, or the like. Further, for inner walls of the Z-directed groove, all regions are insulated except a region in which the Z-directed transmission line is plated. The Z-directed transmission line may be the following first Z-directed transmission line or second Z-directed transmission line. In addition, the some subboards described above mean at least one subboard. In one embodiment, the some subboards mean more than two subboards. The first pad and the second pad are located on one side of the Z-directed groove. It should be noted that, for ease of description, in this application, the side of the Z-directed groove on which the first pad and the second pad are located is defined as a first side of the Z-directed groove. In addition, in inner walls of the Z-directed groove, an inner wall closer to the first pad and the second pad is defined as a first inner wall ("first inner wall" is directly used hereinafter without further clarification).

There is a first Z-directed transmission line on the first inner wall, and both the first pad and the second pad are connected to the first Z-directed transmission line. It should be noted that, in this application, the thickness direction of the multilayer PCB is defined as a Z direction, and the first Z-directed transmission line is a transmission line extending in the Z direction.

In one embodiment, the first Z-directed transmission line is a straight line, and the first Z-directed transmission line is perpendicular to a plane of the surface of the multilayer PCB.

In one embodiment, a length of the Z-directed groove is greater than or equal to a minimum distance between the first pad and the second pad. The length of the Z-directed groove is a distance between two points with a longest distance in an opening corresponding to the Z-directed groove on the surface of the multilayer PCB.

It should be noted that, in this application, the longitudinal direction of the Z-directed groove (referred to "a length direction of the Z-directed groove" hereinafter) is the same as a row direction of the pad array, or is the same as a column direction of the pad array. Further, the length direction of the Z-directed groove is perpendicular to a width direction of the Z-directed groove (or a latitudinal direction of the Z-directed groove). It should be known that, in the pad array, the row direction of the pad array is perpendicular to the column direction of the pad array. Therefore, when the length direction of the Z-directed groove is the same as the row direction of the pad array, the width direction of the Z-directed groove is the same as the column direction of the pad array. When the length direction of the Z-directed groove is the same as the column direction of the pad array, the width direction of the Z-directed groove is the same as the row direction of the pad array.

In one embodiment, the opening corresponding to the Z-directed groove on the surface of the multilayer PCB is a long thin slit in shape. It should be known that a length of the slit is the length of the Z-directed groove. It should be noted that the first pad and the second pad may be located in one row or one column.

In one embodiment, if the first pad and the second pad are located in one row, the length direction of the Z-directed groove is the same as the row direction of the pad array, or in other words, the length direction of the Z-directed groove is the row direction of the pad array. Specifically, refer to a padding unit 21 in FIG. 4A. In the padding unit 21, two pads are located in one row, and the other two pads are also located in one row. Therefore, a length direction of a Z-directed groove between the two pads and the other two pads is the same as a row direction of the pad array.

In one embodiment, if the first pad and the second pad are located in one column, the length direction of the Z-directed groove is the same as the column direction of the pad array, or in other words, the length direction of the Z-directed groove is the column direction of the pad array. Specifically, refer to a padding unit 11 and a padding unit 22 in FIG. 4A. The following uses the padding unit 11 as an example for description. It is easily seen that, in the padding unit 11, two pads are located in one column, and the other two pads are also located in one column. Therefore, a length direction of a Z-directed groove between the two pads and the other two pads is the same as a column direction of the pad array.

In one embodiment, a thickness of the first Z-directed transmission line is greater than zero and less than half of the width of the Z-directed groove. Specifically, the thickness of the first Z-directed transmission line may be greater than or equal to 15 micrometers or less than or equal to 50 micrometers.

It should be known that, similar to a thick copper layer plated onto an inner wall of a via in the prior art, the first Z-directed transmission line is plated onto an inner wall of the Z-directed groove, and the first Z-directed transmission line is essentially also a thick copper layer. Therefore, like a thickness of the thick copper layer, the thickness of the first Z-directed transmission line is a distance between a face of the first Z-directed transmission line fitting onto the inner wall of the Z-directed groove and a face of the first Z-directed transmission line opposite to the face fitting onto the inner wall of the Z-directed groove.

In one embodiment, in the thickness direction of the multilayer PCB, a width of the first Z-directed transmission line is fixed, and the width of the first Z-directed transmission line is greater than or equal to 4 mils and less than or equal to 50 mils. The width of the first Z-directed transmission line is a width of a projection of the first Z-directed transmission line in the Z direction on a plane of the surface of the multilayer PCB.

It should be noted that, both the first pad and the second pad are connected to the one first Z-directed transmission line, and both the first pad and the second pad may be ground pads, or power pads connected to a same power supply.

It should be noted that the multilayer PCB in this application includes a signal layer, a power layer, and a ground layer. Correspondingly, when both the first pad and the second pad are ground pads, one end of the first Z-directed transmission line, farther from the surface of the multilayer PCB, is connected to the ground layer. When both the first pad and the second pad are power pads connected to a same power supply, one end of the first Z-directed transmission line, farther from the surface of the multilayer PCB, is connected to the power layer.

It should be further noted that the first pad and the second pad may be in direct contact with the first Z-directed transmission line, or may be connected to the first Z-directed transmission line each through a metallic wire.

From any embodiment described above, it is easily known that, in this application, one Z-directed groove corresponds to two pads, and therefore Z-directed grooves are arranged less densely than vias in the prior art. Correspondingly, if a quantity of pads is given, a quantity of Z-directed grooves that need to be bypassed in wiring of a signal wire in this application is less than a quantity of vias that need to be bypassed in the prior art. Therefore, the technical solution provided in this embodiment makes wiring of signal wires easier to at least some extent.

Further, the padding unit further includes a third pad and a fourth pad. The first pad is adjacent to both the second pad and the fourth pad, and the third pad is also adjacent to both the second pad and the fourth pad. It should be noted that the first pad is not adjacent to the third pad. It should be understood that the first pad to the fourth pad are located at four corners of a rectangle, respectively.

The third pad and the fourth pad are also located on one side of the Z-directed groove. As is defined before, the first pad and the second pad are located on the first side of the Z-directed groove. The side of the Z-directed groove on which the third pad and the fourth pad are located is now defined as a second side of the Z-directed groove. The second side and the first side are two sides of the Z-directed groove opposite to each other (for the two sides opposite to each other, refer to FIG. 5A, where a side on which a pad 1 and a pad 2 are located is a first side, a side on which a pad 3 and a pad 4 are located is a second side, and the first side and the second side are two sides opposite to each other). Further, in this application, an inner wall of the Z-directed groove closer to the third pad and the fourth pad is defined as a second inner wall.

There may be one second Z-directed transmission line or two second Z-directed transmission lines on the second inner wall. The second Z-directed transmission line also extends in the Z direction.

In one embodiment, the second Z-directed transmission line is a straight line, and the second Z-directed transmission line is perpendicular to a plane of the surface of the multilayer PCB.

In one embodiment, a thickness of the second Z-directed transmission line is greater than zero and less than half of the width of the Z-directed groove. Specifically, the thickness of the second Z-directed transmission line may be greater than or equal to 15 micrometers or less than or equal to 50 micrometers. It should be noted that, for a definition of the thickness of the second Z-directed transmission line in this application, reference may be made to the definition of the thickness of the first Z-directed transmission line. No more details are described herein.

In one embodiment, in the thickness direction of the multilayer PCB, a width of the second Z-directed transmission line is fixed, and the width of the second Z-directed transmission line is greater than or equal to 4 mils and less than or equal to 50 mils. The width of the second Z-directed transmission line is a width of a projection of the second Z-directed transmission line in the Z direction on a plane of the surface of the multilayer PCB.

In an embodiment of this application, there is a second Z-directed transmission line on the second inner wall, and both the third pad and the fourth pad are connected to the second Z-directed transmission line. It should be noted that the second Z-directed transmission line is isolated from the first Z-directed transmission line on the first inner wall.

It should be noted that, when both the third pad and the fourth pad are connected to one second Z-directed transmission line, both the third pad and the fourth pad may be ground pads, or power pads connected to a same power supply. It should be noted that, when both the third pad and the fourth pad are ground pads, one end of the second Z-directed transmission line, farther from the surface of the multilayer PCB, is connected to the ground layer. When both the third pad and the fourth pad are power pads connected to a same power supply, one end of the second Z-directed transmission line, farther from the surface of the multilayer PCB, is connected to the power layer.

Figure 5A:
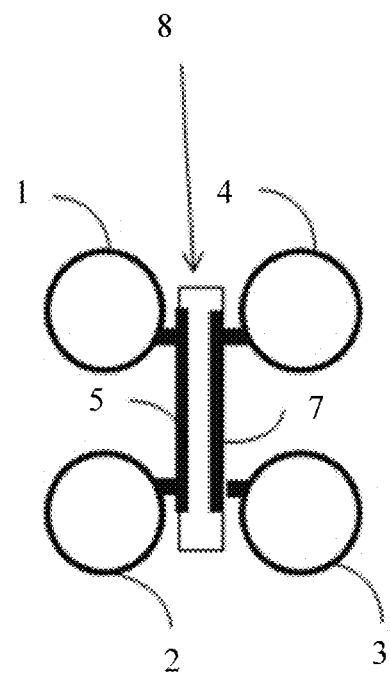
FIG. 5A is a structural diagram of a padding unit according to this application.

FIG. 5A is a structural diagram of a padding unit according to this application. As shown in FIG. 5A, a first pad 1 is adjacent to both a second pad 2 and a fourth pad 4, a third pad 3 is also adjacent to both the second pad 2 and the fourth pad 4, but the first pad 1 is not adjacent to the third pad 3. The first pad 1 and the second pad 2 are located on one side of a Z-directed groove 8, and the third pad 3 and the fourth pad 4 are located on the other side of the Z-directed groove 8. There is a first Z-directed transmission line 5 on an inner wall of the Z-directed groove 8 closer to the first pad 1 and the second pad 2, and both the first pad 1 and the second pad 2 are connected to the first Z-directed transmission line 5. There is a second Z-directed transmission line 7 on an inner wall of the Z-directed groove 8 closer to the third pad 3 and the fourth pad 4, and both the third pad 3 and the fourth pad 4 are connected to the second Z-directed transmission line 7. Further, in the padding unit shown in FIG. 5A, the first pad 1 is connected to the first Z-directed transmission line 5 through a metallic wire, the second pad 2 is connected to the first Z-directed transmission line 5 also through a metallic wire, the third pad 3 is connected to the second Z-directed transmission line 7 also through a metallic wire, and the fourth pad 4 is connected to the second Z-directed transmission line 7 also through a metallic wire.

In another embodiment of this application, there are two second Z-directed transmission lines on the second inner wall. The third pad is connected to one of the two second Z-directed transmission lines, and the fourth pad is connected to the other of the two second Z-directed transmission lines. It should be noted that both the two second Z-directed transmission lines are isolated from the first Z-directed transmission line.

In one embodiment, a spacing between each of the second Z-directed transmission lines and the first Z-directed transmission line may be greater than or equal to 4 mils and less than or equal to a width of the Z-directed groove.

It should be noted that the two second Z-directed transmission lines may be isolated from each other or may be in contact with each other.

In one embodiment, if the two second Z-directed transmission lines are in contact with each other, both the third pad and the fourth pad may be ground pads, or power pads connected to a same power supply.

In one embodiment, if the two second Z-directed transmission lines are isolated from each other, the third pad and the fourth pad may be pads of different types, or signal pads configured to receive a pair of differential signals, or signal pads configured to receive different single-ended signals, or power pads configured to receive different power supplies. Naturally, if the two second Z-directed transmission lines are isolated from each other, both the third pad and the fourth pad may be ground pads, or power pads connected to a same power supply. Refer to the padding unit surrounded by a dashed circle in FIG. 4B. It is easily seen that there are two second Z-directed transmission lines isolated from each other on the second inner wall of the padding unit. The two second Z-directed transmission lines are connected to pads of different types.

In one embodiment, that "the third pad and the fourth pad may be pads of different types" may be that, of the third pad and the fourth pad, one is a ground pad and the other one is a power pad; or one is a ground pad and the other one is a signal pad for receiving a single-ended signal; or one is a power pad and the other one is a signal pad for receiving a single-ended signal.

As described above, the multilayer PCB in this application includes a signal layer, a power layer, and a ground layer. It should be further noted that the multilayer PCB may include one signal layer or more than two signal layers. When the multilayer PCB includes more than two signal layers, signals transmitted at different signal layers are different. Further, the multilayer PCB may include only one power layer or more than two power layers. When the multilayer PCB includes more than two power layers, different power layers provide different power supplies. Similarly, the multilayer PCB may include only one ground layer or more than two ground layers. Regardless of how many ground layers the multilayer PCB includes, all ground layers serve the same purpose.

Correspondingly, when both the third pad and the fourth pad are ground pads, ends of the two second Z-directed transmission lines, farther from the surface of the multilayer PCB, are both connected to one ground layer, or respectively connected to two ground layers.

When both the third pad and the fourth pad are power pads connected to a same power supply, ends of the two second Z-directed transmission lines, farther from the surface of the multilayer PCB, are both connected to one power layer, or respectively connected to two power layers.

Further, when the third pad and the fourth pad are signal pads configured to receive a pair of differential signals, or signal pads configured to receive different single-ended signals, one end of the second Z-directed transmission line, farther from the surface of the multilayer PCB and connected to the third pad, and one end of the second Z-directed transmission line, farther from the surface of the multilayer PCB and connected to the fourth pad, are connected to different signal layers.

When the third pad and the fourth pad are power pads configured to receive different power supplies, one end of the second Z-directed transmission line, farther from the surface of the multilayer PCB and connected to the third pad, and one end of the second Z-directed transmission line, farther from the surface of the multilayer PCB and connected to the fourth pad, are connected to different power layers.

When one of the third pad and the fourth pad is a ground pad, and the other pad is a power pad, one end of the second Z-directed transmission line, farther from the surface of the multilayer PCB and connected to the ground pad, is connected to the ground layer, and one end of the second Z-directed transmission line, farther from the surface of the multilayer PCB and connected to the power pad, is connected to the power layer.

When one of the third pad and the fourth pad is a ground pad, and the other pad is a signal pad for receiving a single-ended signal, one end of the second Z-directed transmission line, farther from the surface of the multilayer PCB and connected to the ground pad, is connected to the ground layer, and one end of the second Z-directed transmission line, farther from the surface of the multilayer PCB and connected to the signal pad for receiving a single-ended signal, is connected to the signal layer.

When one of the third pad and the fourth pad is a power pad, and the other pad is a signal pad for receiving a single-ended signal, one end of the second Z-directed transmission line, farther from the surface of the multilayer PCB and connected to the power pad, is connected to the power layer, and one end of the second Z-directed transmission line, farther from the surface of the multilayer PCB and connected to the signal pad for receiving a single-ended signal, is connected to the signal layer.

It should be noted that, in one padding unit, there may be only two pads configured to receive a pair of differential signals, and the two pads are the first pad and the second pad or the two pads are the third pad and the third pad.

It should be noted that, when more than two signal pads configured to receive single-ended signals are present in one padding unit, correspondingly any two of the more than two single-ended signals are different. "More than" or "less than" used in this application is inclusive of the number modified. For example, "more than two" is inclusive of two itself.

In one embodiment, when the two second Z-directed transmission lines are isolated from each other, a spacing between the two second Z-directed transmission lines may be greater than or equal to 4 mils and less than or equal to a length of the Z-directed groove.

It is easily understood that, the third pad may be in direct contact with the second Z-directed transmission line corresponding to the third pad, or may be connected to the second Z-directed transmission line through a first metallic wire. The second Z-directed transmission line corresponding to the third pad is the one of the two Z-directed transmission lines that is connected to the third pad.

In one embodiment, when the third pad is connected to the second Z-directed transmission line corresponding to the third pad, through the first metallic wire, one end of the first metallic wire is in contact with the third pad, and the other end is in contact with the second Z-directed transmission line corresponding to the third pad. In addition, the first metallic wire is perpendicular to the second Z-directed transmission line corresponding to the third pad.

It is understood that, the fourth pad may be in direct contact with a second Z-directed transmission line corresponding to the fourth pad, or may be connected to the second Z-directed transmission line through a second metallic wire. The second Z-directed transmission line corresponding to the fourth pad is the one of the two Z-directed transmission lines that is connected to the fourth pad.

In one embodiment, when the fourth pad is connected to the second Z-directed transmission line corresponding to the fourth pad through the second metallic wire, one end of the second metallic wire is in contact with the fourth pad, and the other end is in contact with the second Z-directed transmission line corresponding to the fourth pad. In addition, the second metallic wire is perpendicular to the second Z-directed transmission line corresponding to the fourth pad.

In one embodiment, when the third pad is connected to one of the second Z-directed transmission lines, and the fourth pad is connected to the other second Z-directed transmission lines, a width of the first Z-directed transmission line may be greater than a width of the second Z-directed transmission line. In the thickness direction of the multilayer PCB, the width of the first Z-directed transmission line may be fixed or variable (for example, has more than two width values). Similarly, in the thickness direction of the multilayer PCB, the width of the second Z-directed transmission line may be fixed or variable (for example, has more than two width values).

In one embodiment, in the thickness direction of the multilayer PCB, both the width of the first Z-directed transmission line and the width of the second Z-directed transmission line are fixed. In addition, the width of the first Z-directed transmission line is a width of a projection of the first Z-directed transmission line on a plane of the surface of the multilayer PCB in the thickness direction of the multilayer PCB, and the width of the second Z-directed transmission line is a width of a projection of the second Z-directed transmission line on the plane of the surface of the multilayer PCB in the thickness direction of the multilayer PCB. In this embodiment, the width of the first Z-directed transmission line is greater than the width of the second Z-directed transmission line. In comparison with a case in which the width of the first Z-directed transmission line is equal to the width of the second Z-directed transmission line, the solution provided in this embodiment can ensure that two signals transmitted on the first Z-directed transmission line are also transmitted at a relatively high rate.

In one embodiment, the width of the first Z-directed transmission line is a width of a projection of an end face of the first Z-directed transmission line on the plane of the surface of the multilayer PCB in the thickness direction of the multilayer PCB, where the end face is in contact with the first pad and the second pad. The width of the second Z-directed transmission line is a width of a projection of an end face of the second Z-directed transmission line on the plane of the surface of the multilayer PCB in the thickness direction of the multilayer PCB, where the end face is in contact with the third pad or the fourth pad. In this embodiment, the width of the first Z-directed transmission line is greater than the width of the second Z-directed transmission line. In comparison with a case in which the width of the first Z-directed transmission line is equal to the width of the second Z-directed transmission line, the solution provided in this embodiment can ensure that the two pads connected to the first Z-directed transmission line are both in good contact with the first Z-directed transmission line.

Figure 5B:
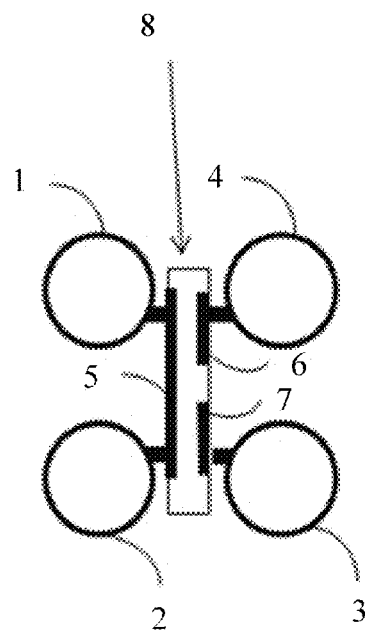
FIG. 5B is a structural diagram of another padding unit according to this application.

FIG. 5B is a structural diagram of another padding unit according to this application. The following describes only what the padding unit shown in FIG. 5B is different from the padding unit shown in FIG. 5A. For similarities, refer to the foregoing descriptions of FIG. 5A. No more details are described herein. The padding unit shown in FIG. 5B is different from the padding unit shown in FIG. 5A in that there are a second Z-directed transmission line 6 and a second Z-directed transmission line 7 on an inner wall of a Z-directed groove 8 closer to a third pad 3 and a fourth pad 4, where the third pad 3 is connected to the second Z-directed transmission line 7, and the fourth pad 4 is connected to the second Z-directed transmission line 6.

Figure 6:
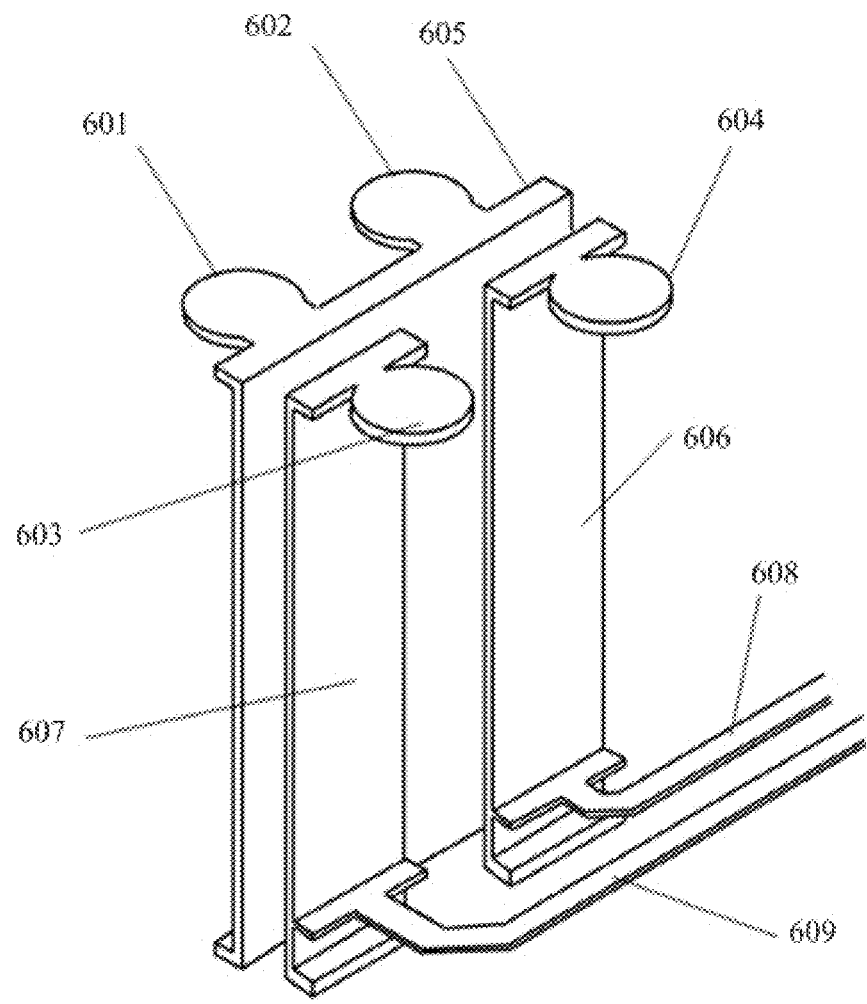
FIG. 6 is a three-dimensional diagram of the padding unit shown in FIG. 5B.

Further, FIG. 6 is a three-dimensional diagram of the padding unit shown in FIG. 5B. A pad 601 in FIG. 6 is corresponding to the first pad 1 in FIG. 5B, a pad 602 in FIG. 6 is corresponding to the second pad 2 in FIG. 5B, a pad 603 in FIG. 6 is corresponding to the third pad 3 in FIG. 5B, and a pad 604 in FIG. 6 is corresponding to the fourth pad 4 in FIG. 5B. A Z-directed transmission line 605 in FIG. 6 is corresponding to the Z-directed transmission line 5 in FIG. 5B, a Z-directed transmission line 606 in FIG. 6 is corresponding to the Z-directed transmission line 6 in FIG. 5B, and a Z-directed transmission line 607 in FIG. 6 is corresponding to the Z-directed transmission line 7 in FIG. 5B. As shown in FIG. 6, the pad 601 and the pad 602 are both connected to the Z-directed transmission line 605, the pad 603 is connected to the Z-directed transmission line 607, and the pad 604 is connected to the Z-directed transmission line 606. FIG. 6 further shows two signal wires 608 and 609, indicating that the pad 603 and the pad 604 are connected to a pair of differential signals or each connected to one single-ended signal.

In one embodiment, when two adjacent Z-directed grooves have a same length direction, the two adjacent Z-directed grooves may be communicated with each other. Referring to FIG. 4A, a Z-directed groove corresponding to a padding unit 13 communicates with a Z-directed groove corresponding to a padding unit 23.

Further, when both the first pad and the second pad are located in a $N^{th}$ row, and both the third pad and the fourth pad are located in a $(N+1)^{th}$ row, among a plurality of Z-directed grooves between the $N^{th}$ row and the $(N+1)^{th}$ row, every two adjacent Z-directed grooves communicate with each other. It should be known that N is an integer greater than or equal to 1 and less than or equal to X−1.

It should be noted that, when both the first pad and the second pad are located in a $N^{th}$ row, and both the third pad and the fourth pad are located in a $(N+1)^{th}$ row, a width of the Z-directed groove is less than or equal to a minimal spacing between the $N^{th}$ row of pads and the $(N+1)^{th}$ row of pads. It should be known that, in a pad array, a minimal spacing between two adjacent rows of pads is definite.

Similarly, both the first pad and the second pad are located in a $M^{th}$ column, and both the third pad and the fourth pad are located in a $(M+1)^{th}$ column. Among a plurality of Z-directed grooves between the $M^{th}$ column and the $(M+1)^{th}$ column, every two adjacent Z-directed grooves communicate with each other. M is an integer greater than or equal to 1 and less than or equal to Y−1.

It should be noted that, when both the first pad and the second pad are located in a $M^{th}$ column, and both the third pad and the fourth pad are located in a $(M+1)^{th}$ column, a width of the Z-directed groove is less than or equal to a minimal spacing between the $M^{th}$ column of pads and the $(M+1)^{th}$ column of pads. It should be known that, in a pad array, a minimal spacing between two adjacent columns of pads is definite.

In one embodiment, in this application, the Z-directed groove is filled with non-conductive dielectric. The non-conductive dielectric is non-conductive resin. It should be noted that the Z-directed groove is filled with the non-conductive dielectric, a substance is different from components of the multilayer PCB, and the Z-directed groove is formed inside the multilayer PCB. Therefore, in an actual multilayer PCB product, the Z-directed groove may not be directly seen.

It should be noted that, as limited above, for the inner walls of the Z-directed groove, all regions are insulated except the region in which the Z-directed transmission line is plated. In addition, the Z-directed transmission line may be the first Z-directed transmission line or the second Z-directed transmission line. In this application, every Z-directed transmission line is isolated from every other Z-directed transmission line, and therefore, the limitation that, for the inner walls of the Z-directed groove, all regions are insulated except the region in which the Z-directed transmission line is plated can ensure that any two Z-directed transmission lines are insulated from each other, thereby avoiding that quality of signals transmitted on the two Z-directed transmission lines is affected by mutual crosstalk.

It should be noted that, in this application, a signal wire on the signal layer may pass through a region between two adjacent Z-directed grooves, or pass through a region between a Z-directed groove and a via that are adjacent.

It should be known that, the pad array may include a plurality of padding units, and every pad in the pad array is located in one padding unit. Alternatively, the pad array may include more than one padding unit but also include other pads in addition to pads included in the more than one padding unit, where the other pads are connected to vias, as is the case in the prior art. When the pad array includes not only a padding unit but also other pads connected to vias, there is a Z-directed groove that is adjacent to a via. Correspondingly, a signal wire may be wired in a region between the Z-directed groove and the via that are adjacent.

The foregoing descriptions are merely specific implementations of the present invention, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A multilayer printed circuit board (PCB), comprising:
a plurality of layers of subboards;
an X-row and Y-column pad array disposed on a surface of the multilayer PCB, wherein both X and Y are integers greater than or equal to 2; the pad array comprises at least one padding unit, wherein the padding unit comprises a first pad and a second pad that are adjacent; and
a Z-directed groove, wherein both the first pad and the second pad are located on a first side of the Z-directed groove, and the Z-directed groove penetrates through at least a portion of the subboards of the layers from the surface of the multilayer PCB in a thickness direction of the multilayer PCB; and
a first Z-directed transmission line disposed on a first inner wall closer to the first pad and the second pad in the Z-directed groove, wherein both the first pad and the second pad are connected to the first Z-directed transmission line, and the first Z-directed transmission line extends in the thickness direction of the multilayer PCB.

2. The multilayer PCB according to claim 1, wherein both the first pad and the second pad are ground pads, or power pads connected to a same power supply.

3. The multilayer PCB according to claim 1, wherein the padding unit further comprises a third pad and a fourth pad that are adjacent, the third pad is further adjacent to the second pad, the fourth pad is further adjacent to the first pad, both the third pad and the fourth pad are located on a second side of the Z-directed groove, and the first side and the second side are two sides of the Z-directed groove opposite to each other; and
wherein the multilayer PCB further comprises a second Z-directed transmission line disposed on a second inner wall closer to the third pad and the fourth pad in the Z-directed groove, wherein both the third pad and the fourth pad are connected to the second Z-directed transmission line, the second Z-directed transmission line extends in the thickness direction of the multilayer PCB, and the second Z-directed transmission line is isolated from the first Z-directed transmission line.

4. The multilayer PCB according to claim 3, wherein both the third pad and the fourth pad are ground pads, or power pads connected to a same power supply.

5. The multilayer PCB according to claim 3, wherein the multilayer PCB comprises a signal layer, a power layer, and a ground layer, wherein
one end of a Z-directed transmission line is connected to the signal pad, and the other end of the Z-directed transmission line is connected to the signal layer; or one end of a Z-directed transmission line is connected to the power pad, and the other end of the Z-directed transmission line is connected to the power layer; or one end of a Z-directed transmission line is connected to the ground pad, and the other end of the Z-directed transmission line is connected to the ground layer; wherein the Z-directed transmission line is the first Z-directed transmission line or the second Z-directed transmission line.

6. The multilayer PCB according to claim 5, wherein on the signal layer, a signal wire passes through a region between the two adjacent Z-directed grooves.

7. The multilayer PCB according to claim 1, wherein the padding unit further comprises a third pad and a fourth pad that are adjacent, the third pad is further adjacent to the second pad, the fourth pad is further adjacent to the first pad, both the third pad and the fourth pad are located on a second side of the Z-directed groove, and the first side and the second side are two sides of the Z-directed groove opposite to each other; and wherein the multilayer PCB further comprises two second Z-directed transmission lines disposed on a second inner wall closer to the third pad and the fourth pad in the Z-directed groove, wherein the third pad and the fourth pad each are connected to one of the second Z-directed transmission lines, the second Z-directed transmission lines extend in the thickness direction of the multilayer PCB, the two second Z-directed transmission lines are isolated from each other, and the second Z-directed transmission lines are both isolated from the first Z-directed transmission line.

8. The multilayer PCB according to claim 7, wherein the third pad and the fourth pad are pads of different types, or signal pads configured to receive a pair of differential signals, or signal pads configured to receive different single-ended signals, or power pads configured to connect different power supplies.

9. The multilayer PCB according to claim 7, wherein the third pad is connected to the corresponding second Z-directed transmission line through a first metallic wire, and an extending direction of the first metallic wire is perpendicular to the corresponding second Z-directed transmission line.

10. The multilayer PCB according to claim 7, wherein a width of the first Z-directed transmission line is greater than a width of the second Z-directed transmission line, wherein in the thickness direction of the multilayer PCB, the width of the first Z-directed transmission line is fixed, and the width of the first Z-directed transmission line is a width of a projection of the first Z-directed transmission line on a plane of the surface of the multilayer PCB in the thickness direction of the multilayer PCB; and in the thickness direction of the multilayer PCB, the width of the second Z-directed transmission line is fixed, and the width of the second Z-directed transmission line is a width of a projection of the second Z-directed transmission line on the plane of the surface of the multilayer PCB in the thickness direction of the multilayer PCB.

11. The multilayer PCB according to claim 1, wherein when the first pad and the second pad are located in one row, a length direction of the Z-directed groove is a row direction of the pad array; or when the first pad and the second pad are located in one column, a length direction of the Z-directed groove is a column direction of the pad array; wherein the length direction of the Z-directed groove is a direction of a connection line between two points with a longest distance in an opening corresponding to the Z-directed groove on the surface of the multilayer PCB.

12. The multilayer PCB according to claim 11, wherein when two adjacent Z-directed grooves have a same length direction, the two adjacent Z-directed grooves communicate with each other.

13. The multilayer PCB according to claim 1, wherein the Z-directed groove is filled with non-conductive dielectric.

14. A communications device, comprising a multilayer printed circuit board (PCB) and an input/output chip, wherein the multilayer PCB comprises a plurality of layers of subboards;

an X-row and Y-column pad array on a surface of the multilayer PCB, wherein both X and Y are integers greater than or equal to 2; the pad array comprises at least one padding unit, wherein the padding unit comprises a first pad and a second pad that are adjacent;

a Z-directed groove, wherein both the first pad and the second pad are located on a first side of the Z-directed groove, and the Z-directed groove penetrates through at least a portion of the subboards of the layers from the surface of the multilayer PCB in a thickness direction of the multilayer PCB;

a first Z-directed transmission line disposed on a first inner wall closer to the first pad and the second pad in the Z-directed groove, wherein both the first pad and the second pad are connected to the first Z-directed transmission line, and the first Z-directed transmission line extends in the thickness direction of the multilayer PCB; and wherein the input/output chip includes the X-row and Y-column pin array, and both X and Y are integers greater than or equal to 2; and pins of the input/output chip are in a one-to-one correspondence with pads on a surface of the multilayer PCB, and each pin is in contact with a corresponding pad.

* * * * *